US006456171B1

(12) United States Patent
Chen

(10) Patent No.: US 6,456,171 B1
(45) Date of Patent: Sep. 24, 2002

(54) PROBES FOR A WAVEGUIDE

(75) Inventor: Mao-Jen Chen, Chung-Li (TW)

(73) Assignee: Prime Electronics & Statellitcs Inc. (TW)

( * ) Notice: Subject to any disclaimer, the term of this patent is extended or adjusted under 35 U.S.C. 154(b) by 0 days.

(21) Appl. No.: 09/928,419

(22) Filed: Aug. 14, 2001

(51) Int. Cl.$^{7}$ .................................................. H03H 5/00

(52) U.S. Cl. ............................ 333/26; 333/33; 333/248

(58) Field of Search ............................ 333/248, 26, 33, 333/748, 21, 128, 242, 137; 343/859

(56) References Cited

U.S. PATENT DOCUMENTS 5,440,279 A * 8/1995 Kinoshita et al. ........... 333/128
5,737,698 A * 4/1998 Gabrelian et al. ........ 333/21 A
6,041,219 A * 3/2000 Peterson ..................... 333/242
6,043,789 A * 3/2000 Suzuki et al. ............. 333/21 A

* cited by examiner

*Primary Examiner*—Michael J. Tokar
*Assistant Examiner*—Linh Van Nguyen
(74) *Attorney, Agent, or Firm*—Troxell Law Office PLLC

(57) ABSTRACT

A waveguide is provided on a circuit board thereof with two printed probes that are perpendicular to and spaced from each other by a predetermined distance to receive electric waves guided into the waveguide in two different directions. The two probes are separately located in two rectangular patterns that are provided outside a round pattern. The two rectangular patterns are separately located at a lower or an upper side and to a lateral side of the round pattern and both have a feed opening provided at an edge adjacent to the round pattern. Thus, it is possible to obtain a good cross-polarization isolation between the two probes for them to more effectively receive electric waves without interfering with each other.

1 Claim, 5 Drawing Sheets

PROBES FOR A WAVEGUIDE

BACKGROUND OF THE INVENTION

The present invention relates to probes for a waveguide, and more particularly to two probes that are printed on a circuit board in two substantially rectangular patterns separately located outside a round pattern near a lateral and a lower or an upper side thereof, so that a sufficient cross-polarization isolation exists between the two probes for them to more effectively and stably receive electric waves without interfering-with each other.

FIG. 1 shows a conventional waveguide 10 that includes a cup-shaped tube portion 11, a body portion 12, a circuit board 13, and two probe pins 14, 15. The probe pins 14, 15 are spaced from and perpendicular to each other, so as to receive waves from different directions and then transmit the received waves as signals to the circuit board 13, at where the received signals are processed.

The probe pins 14, 15 for the conventional waveguide 10 have the following disadvantages:

1. The probe pins 14, 15 are three-dimensional members projected from inner surfaces of the waveguide 10, and are therefore easily broken due to unexpected collision or impact.
2. The probe pins 14, 15 are three-dimensional members projected from inner surfaces of the waveguide 10, and therefore occupy considerable space in the waveguide 10, preventing the waveguide 10 from a small volume.
3. The cup-shaped tube portion 11 must have extended length to accommodate the long probe pins 14, 15. For the purpose of eliminating the above-mentioned disadvantages in the conventional waveguide 10, the inventor of the present invention has developed a waveguide 20 having coplanar printed probes as shown in FIGS. 2, 3 and 4. As shown, the waveguide 20 includes a cup-shaped tube portion 21, a body portion 22 vertically connected to a rear side of the cup-shaped tube portion 21, and a circuit board 23 mounted on the body portion 22 and perpendicular to the tube portion 21. The circuit board 23 is provided thereon with a substantially round pattern 23*a*, as shown in FIG. 3. A probe 23*b* is provided on a right side of the round pattern 23*a*, and another probe 23*c* is provided in a substantially rectangular pattern 23*f* to a left side of the round pattern, so that the probes 23*b* and 23*c* are perpendicular to and spaced from each other by a predetermined distance to avoid interference between two electric waves in two directions perpendicular to each other. The cup-shaped tube portion 21 is provided at a position adjacent to the probe 23*c* with a guide slot 23*d*, so that electric waves in the direction of the guide slot 23*d* of the cup-shaped tube portion 21 can be effectively received by the probe 23*c* and converted into electronic signals.

An advantage of the above-mentioned waveguide 20 is that the provision of the printed patterns and the guide slot 23*d* allows the coplanar probes 23*b* and 23*c* to be spaced from each other by a predetermined distance, so that electric waves could be effectively processed without causing wave interference.

However, since the probe 23*b* is provided in the round pattern 23*a*, there is an insufficient cross-polarization isolation between the probe 23*b* and the probe 23*c* provided in the rectangular pattern 23*f*. When the cross-polarization isolation between the probe 23*b* and the probe 23*c* is improved, an even better signal processing ability of the waveguide could be obtained.

It is therefore tried by the inventor to develop an improved circuit pattern to enhance the signal receiving ability of the waveguide.

SUMMARY OF THE INVENTION

A primary object of the present invention is to provide two printed probes on a circuit board of a waveguide, such that a sufficient cross-polarization isolation exists between the two probes for them to effectively receive electric waves from different directions without interfering with each other.

To achieve the above and other objects, the two printed probes of the present invention are printed on one side of the circuit board opposite to a cup-shaped tube portion of the waveguide at positions perpendicular to and spaced from each other by a predetermined distance. The two probes are separately located in two rectangular patterns that are provided outside a round pattern on the circuit board. The two rectangular patterns are separately located at a lower or an upper side and to a lateral side of the round pattern and both have a feed opening provided at an edge adjacent to the round pattern. Thus, it is possible to obtain a good cross-polarization isolation between the two probes for them to effectively receive electric waves in different directions without interfering with each other.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention is intended to provide probes for a waveguide to enhance a signal receiving ability of the waveguide. Since a basic structure of the waveguide having printed probes has been described in the background of the invention with reference to FIGS. 2 to 4, a description thereof is omitted herein.

Figure 1:
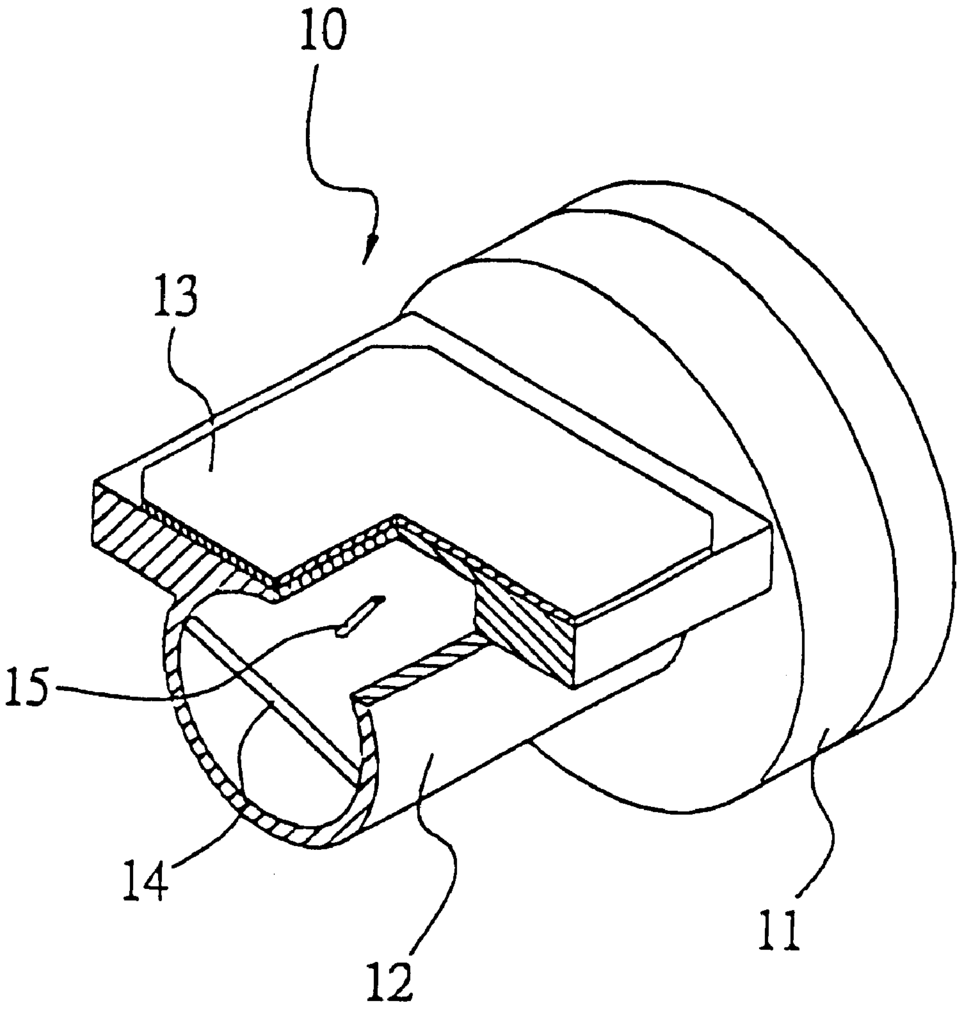
FIG. 1 PRIOR ART
FIG. 1 is a perspective view of a conventional waveguide, apart of which is cut away to show an internal structure thereof.
Figure 2:
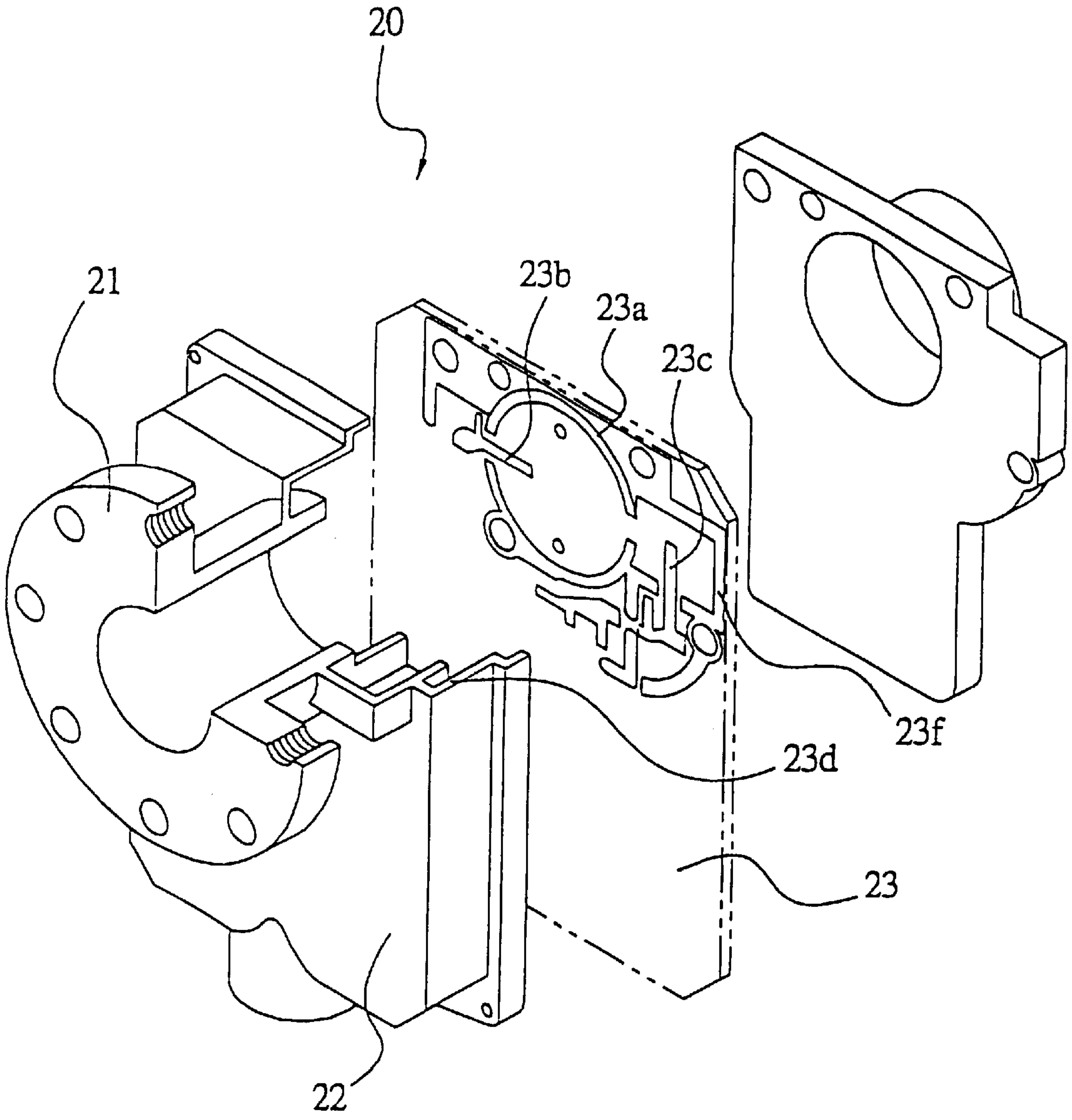
FIG. 2 is an exploded perspective view of a waveguide having coplanar printed probes, based on which probes for a waveguide according to the present invention are developed.
Figure 3:
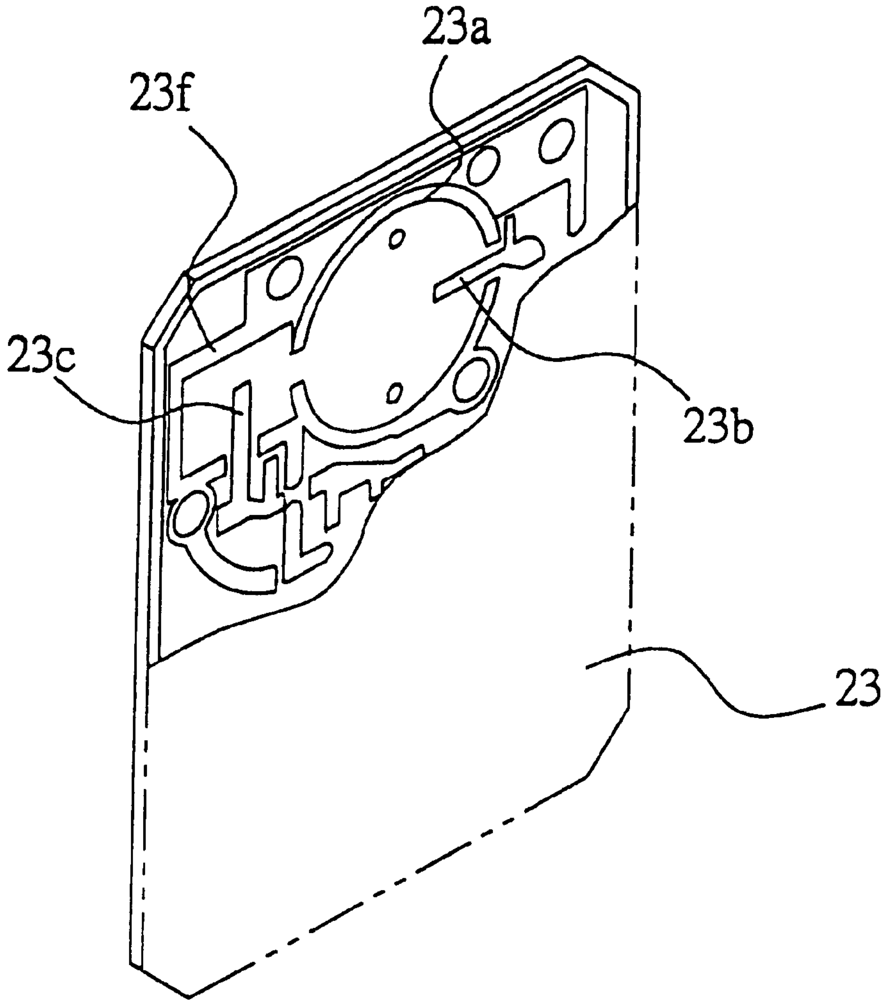
FIG. 3 shows circuit patterns on a circuit board for the waveguide of FIG. 2.
Figure 4:
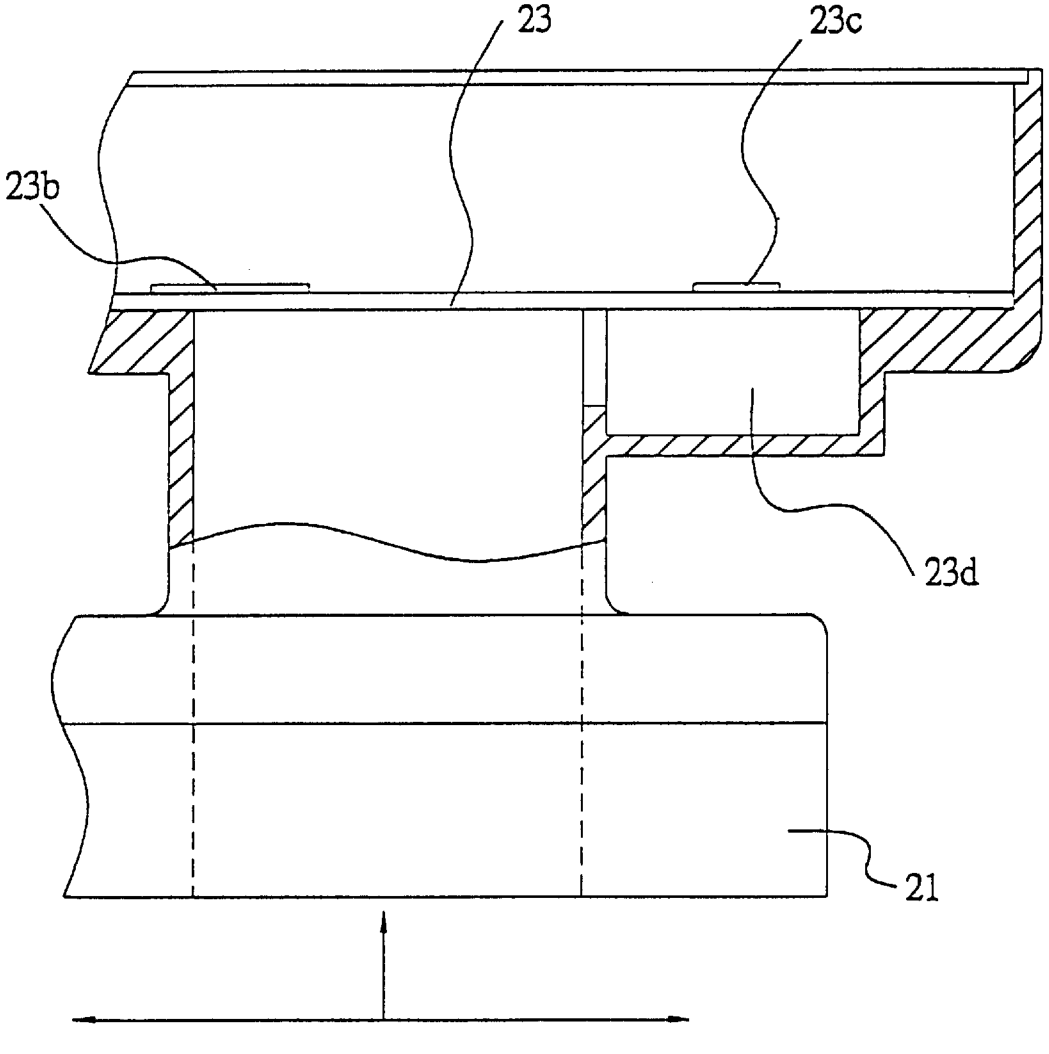
FIG. 4 is a fragmentary cross sectional view of the waveguide of FIG. 2 near a cup-shaped tube portion thereof.

Please refer to FIG. 5 that shows a circuit board that is used with a waveguide as described with reference to FIGS. 2, 3 and 4 and having a circuit pattern that makes the waveguide probes of the present invention superior to the conventional ones.

Figure 5:
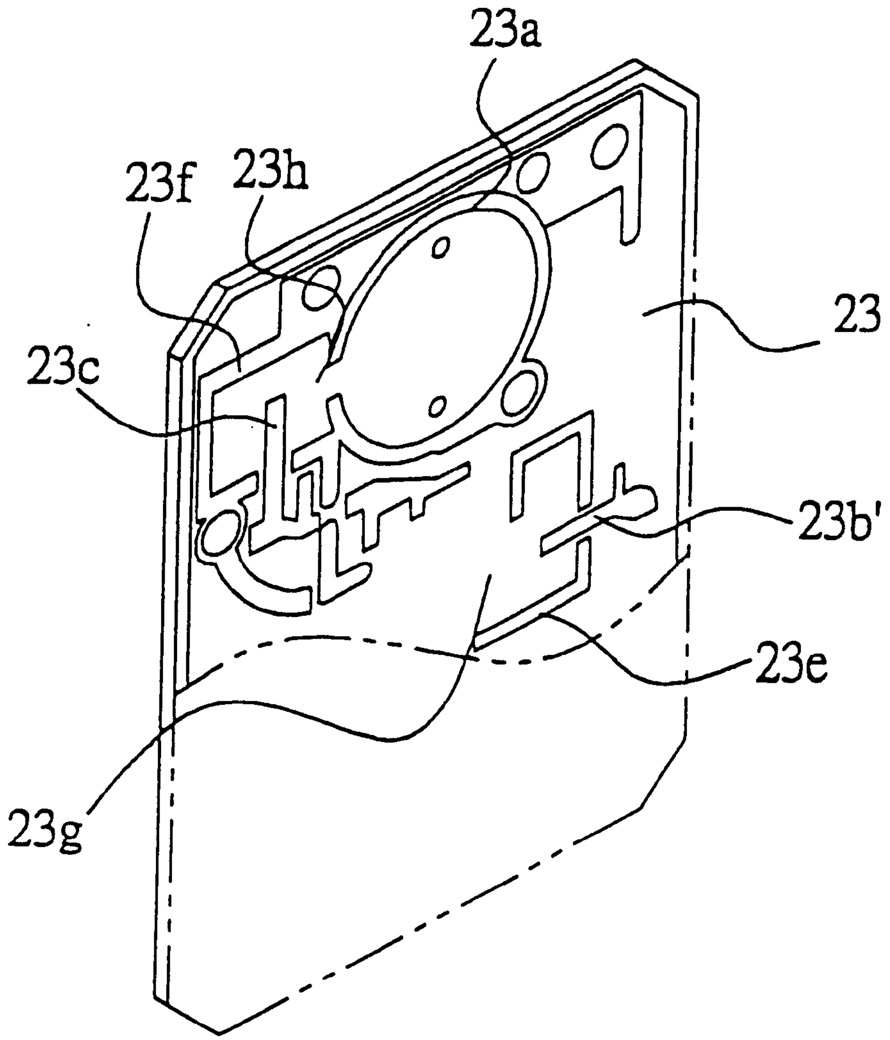
FIG. 5 shows circuit patterns on a circuit board having the probes for a waveguide according to the present invention.

As shown in FIG. 5, there is provided on the circuit board 23 two probes 23*b*', 23*c* perpendicular to and spaced from one another by a predetermined distance. The two probes 23*b*', 23*c* are located in two substantially rectangular patterns 23*e* and 23*f*, respectively. The two rectangular patterns

23_e_, 23_f_ are provided on the circuit board 23 outside a round pattern 23_a_, so that they are located near a lower side and a lateral side of the round pattern 23_a_, respectively. Alternatively, the rectangular pattern 23_e_ may be located near an upper side of the round pattern 23_a_. Both the rectangular patterns 23_e_ and 23_f_ are provided at an edge adjacent to the round pattern with a feed opening 23_g_ and 23_h_, respectively.

The provision of the two probes 23_b_' and 23_c_ in two rectangular patterns 23_e_, 23_f_, respectively, effectively increases a cross-polarization isolation between the probes 23_b_' and 23_c_, enabling them to effectively and stably receive electric waves as signals.

According to the present invention, the two probes 23_b_' and 23_c_ are printed on one side of the circuit board 23 facing away from the cup-shaped tube portion of the waveguide, such that the two probes 2.3_b_' and 23_c_ are spaced from each other by a predetermined distance and are in two directions perpendicular to each other. Moreover, the two probes 23_b_' and 23_c_ are located in two rectangular patterns 23_e_ and 23_f_, respectively, that are located at a lower or an upper side and to a lateral side, respectively, of the round pattern 23_a_, it is therefore possible to obtain a good cross-polarization isolation between the two probes 23_b_' and 23_c_ for them to effectively receive signals without interfering with each other.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A set of probes for a waveguide, said waveguide including a cup-shaped tube portion, a body portion connected to an end of said tube portion, and a circuit board connected to said body portion opposite to said tube portion for receiving and processing signals; said set of probes comprising a first and a second probe printed on one side of said circuit board facing away from said cup-shaped tube portion of said waveguide, such that said first and said second probes are spaced from each other by a predetermined distance and are in two directions perpendicular to each other; said second printed probes being provided on said circuit board at a position corresponding to a guide slot provided on said cup-shaped tube portion, so that said second probe is able to receive electric waves guided into said guide slot; said set of probes being characterized in that said first and said second printed probes are separately located in two substantially rectangular patterns, one of said two rectangular patterns having said first probe located therein being provided below or above a substantially round pattern on said circuit board, and the other said rectangular pattern having said second probe located therein being provided outside and to one lateral side of said round pattern, and both said two rectangular patterns being provided at an edge adjacent to said round pattern with a feed opening.

* * * * *